US011569826B2

(12) United States Patent
Tang et al.

(10) Patent No.: US 11,569,826 B2
(45) Date of Patent: Jan. 31, 2023

(54) TIME-DOMAIN INCREMENTAL TWO-STEP CAPACITANCE-TO-DIGITAL CONVERTER

(71) Applicant: BOARD OF REGENTS, THE UNIVERSITY OF TEXAS SYSTEM, Austin, TX (US)

(72) Inventors: Xiyuan Tang, Austin, TX (US); Nan Sun, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 17/176,341

(22) Filed: Feb. 16, 2021

(65) Prior Publication Data

US 2021/0258014 A1   Aug. 19, 2021

Related U.S. Application Data

(60) Provisional application No. 62/977,369, filed on Feb. 16, 2020.

(51) Int. Cl.
*H03M 3/00* (2006.01)
*H03M 1/00* (2006.01)

(52) U.S. Cl.
CPC ........... *H03M 1/002* (2013.01); *H03M 3/458* (2013.01)

(58) Field of Classification Search
CPC ........ H03M 3/46; H03M 1/145; H03M 1/164; H03M 3/426; H03M 1/46; H03M 3/464; H03M 1/1245; H03M 1/38; H03M 1/468; H03M 1/50; H03M 3/344; H03M 3/368; H03M 1/466; H03M 3/458; H03M 1/08; H03M 1/1009; H03M 1/462; H03M 3/454; H03M 3/43; H03M 3/424; H03M 3/422; H03M 3/338; H03M 1/00; H03M 1/001
USPC .......................... 341/155, 156, 143, 161, 162
See application file for complete search history.

(56) References Cited

U.S. PATENT DOCUMENTS

| | | | |
|---|---|---|---|
| 9,397,692 B1 * | 7/2016 | Zanbaghi | H03M 3/438 |
| 9,419,642 B1 * | 8/2016 | Nguyen | H03M 3/42 |
| 9,825,645 B1 * | 11/2017 | Gaggl | H03M 1/0624 |
| 9,900,023 B1 * | 2/2018 | Kinyua | H03M 3/46 |
| 2012/0112936 A1 * | 5/2012 | Huang | H03M 1/502 |
| | | | 341/110 |
| 2015/0145571 A1 * | 5/2015 | Perrott | G04F 10/005 |
| | | | 327/551 |
| 2016/0065231 A1 * | 3/2016 | Gonen | H03M 1/42 |
| | | | 341/156 |
| 2017/0126239 A1 * | 5/2017 | Sun | H03M 3/398 |

(Continued)

OTHER PUBLICATIONS

Chae et al. "6.3 μW 20 bits incremental Zoom-ADC with 6ppm INL and 1 μV Offset" Pub Date 2013 (Year: 2013).*

(Continued)

*Primary Examiner* — Linh V Nguyen
(74) *Attorney, Agent, or Firm* — Meunier Carlin & Curfman LLC

(57) ABSTRACT

An exemplary incremental two-step capacitance-to-digital converter (CDC) with a time-domain sigma-delta modulator (TDΔΣM) includes a voltage-controlled oscillator (VCO)-based integrator that can be used in a low-order loop configuration. Example prototypes are disclosed, which when fabricated in 40-nm CMOS technology, provides CDC resolution of 0.29 fF while dissipating only 0.083 nJ per conversion.

20 Claims, 15 Drawing Sheets

(56) References Cited

U.S. PATENT DOCUMENTS

| | | | |
|---|---|---|---|
| 2017/0170840 A1* | 6/2017 | Zhao | H03M 3/464 |
| 2020/0136639 A1* | 4/2020 | Kinyua | H03M 1/164 |
| 2021/0203287 A1* | 7/2021 | Kinyua | H03F 3/2173 |
| 2021/0258014 A1* | 8/2021 | Tang | H03M 1/46 |

OTHER PUBLICATIONS

Gonen et al. "A Dynamic Zoom ADC with 109-Db DR for Audio Applications" Pub Date 2013 (Year: 2017).*
Art Chae et al. "6.3 μW 20 bits incremental Zoom-ADC with 6ppm INL and 1 μV Offset" Pub Date 2013 (Information Disclosure Statement "IDS" filed Feb. 18, 2022) (Year: 2013).*
Park, Sujin, Geon-Hwi Lee, and SeongHwan Cho. "A 2.92-μW Capacitance-to-Digital Converter With Differential Bondwire Accelerometer, On-Chip Air Pressure, and Humidity Sensor in 0.18-μm CMOS" IEEE Journal of Solid-State Circuits 54.10 (2019): 2845-2856.
Z. Tan, R. Daamen, A. Humbert, Y. V. Ponomarev, Y. Chae, and M. A. Pertijs, "A 1.2-V 8.3-nJ CMOS humidity sensor for RFID applications," IFEE Journal of Solid-State Circuits, vol. 48, No. 10, pp. 2469-2477, 2013.
S. Xia, K. Makinwa, and S. Nihtianov, "A capacitance-to-digital converter for displacement sensing with 17b resolution and 20 μs conversion time," in Solid-State Circuits Conference Digest of Technical Papers (ISSCC), 2012 IEEE International. IEEE, 2012, pp. 198-200.
H.-Y. Tai, Y.-S. Hu, H.-W. Chen, and H.-S. Chen, "A 0.85 fJ/conversion step 10b 200kS/s subranging SAR ADC in 40nm CMOS," in Solid-State Circuits Conference Digest of Technical Papers (ISSCC), 2014 IEEE International. IEEE, 2014, pp. 196-197.
S.-E. Hsieh and C.-C. Hsieh, "A 0.44-fJ/Conversion-Step 11-Bit 600-kS/s SAR ADC With Semi-Resting DAC," IEEE Journal of Solid-State Circuits, vol. 53, No. 9, pp. 2595-2603, 2018.
X. Tang, L. Chen, J. Song, and N. Sun, "A 1.5 fj/conv-step 10b 100kS/s SAR ADC with gain-boosted dynamic comparator," in Solid-State Circuits Conference (A-SSCC), 2017 IEEE Asian. IEEE, 2017, pp. 229-232.
H. Omran, A. Alhoshany, H. Alahmadi, and K. N. Salama, "A 35fJ/Step differential successive approximation capacitive sensor readout circuit with quasi-dynamic operation," in VLSI Circuits (VLSI-Circuits), 2016 IEEE Symposium on. IEEE, 2016, pp. 1-2.
Omran, Hesham, et al. "A 33fJ/step SAR capacitance-to-digital converter using a chain of inverter-based amplifiers." IEEE Transactions on Circuits and Systems I: Regular Papers 64.2 (2016): 310-321.
A. Alhoshany, H. Omran, and K. N. Salama, "A 45.8 fJ/Step, energy-efficient, differential SAR capacitance-to-digital converter for capacitive pressure sensing," Sensors and Actuators A: Physical, vol. 245, pp. 10-18, 2016.
H. Ha, D. Sylvester, D. Blaauw, and J.-Y. Sim, "A 160nW 63.9 fj/conversionstep capacitance-to-digital converter for ultra-low-power wireless sensor nodes," in Solid-State Circuits Conference Digest of Technical Papers (ISSCC), 2014 IEEE International. IEEE, 2014, pp. 220-221.
Z. Tan, R. Daamen, A. Humbert, K. Souri, Y. Chae, Y. V. Ponomarev, and M. A. Pertijs, "A 1.8 V 11W CMOS smart humidity sensor for RFID sensing applications," in IEEE Asian Solid-State Circuits Conference 2011. IEEE, 2011, pp. 105-108.
D.-Y. Shin, H. Lee, and S. Kim, "A delta-sigma interface circuit for capacitive sensors with an automatically calibrated zero point," IEEE Transactions on Circuits and Systems II: Express Briefs, vol. 58, No. 2, pp. 90-94, 2011.
S. Jawed, D. Cattin, M. Gottardi, N. Massari, A. Baschirotto, and A. Simoni, "A 828 μW 1.8V 80dB dynamic-range readout interface for a MEMS capacitive microphone," in ESSCIRC 2008—34th European Solid-State Circuits Conference. IEEE, 2008, pp. 442-445.

Y. Chae, K. Souri, and K. A. Makinwa, "A 6.3 μW 20bit Incremental Zoom-ADC with 6ppm INL and 1 μV Offset," IEEE Journal of Solid-State Circuits, vol. 48, No. 12, pp. 3019-3027, 2013.
B. Gonen, F. Sebastiano, R. Quan, R. van Veldhoven, and K. A. Makinwa, "A dynamic zoom ADC with 109-dB DR for audio applications," IEEE Journal of Solid-State Circuits, vol. 52, No. 6, pp. 1542-1550, 2017.
S. Karmakar, B. Gonen, F. Sebastiano, R. Van Veldhoven, and K. A. Makinwa, "A 280 μW Dynamic Zoom ADC With 120 dB DR and 118 dB SNDR in 1 kHz BW," IEEE Journal of Solid-State Circuits, vol. 53, No. 12, pp. 3497-3507, 2018.
K. A. Makinwa, A. Baschirotto, and P. Harpe, Efficient sensor interfaces, advanced amplifiers and low power RF systems: advances in analog circuit design 2015. Springer, 2015. 332 pages.
S. Oh, W. Jung, K. Yang, D. Blaauw, and D. Sylvester, "15.4 b incremental sigma-delta capacitance-to-digital converter with zoom-in 9b asynchronous SAR," in VLSI Circuits Digest of Technical Papers, 2014 Symposium on. IEEE, 2014, pp. 1-2.
M. Z. Straayer and M. H. Perrott, "A 12-bit, 10-MHz bandwidth, continuoustime ADC with a 5-bit, 950-MS/s VCO-based quantizer," IEEE Journal of Solid-State Circuit, vol. 43, No. 4, pp. 805-814, 2008.
Y. Yoon, K. Lee, S. Hong, X. Tang, L. Chen, and N. Sun, "A 0.04-mm 2 0.9-mW 71-dB SNDR distributed modular AS ADC with VCO-based integrator and digital DAC calibration," in 2015 IEEE Custom Integrated Circuits Conference (CICC). IEEE, 2015, pp. 1-4.
S. Li and N. Sun, "A 0.028 mm 2 19.8 fJ/step 2nd-order VCO-based CT ΔΣ Modulator using an inherent passive integrator and capacitive feedback in 40nm CMOS," in 2017 Symposium on VLSI Circuits. IEEE, 2017, pp. C36-C37.
S. Li, A. Mukherjee, and N. Sun, "A 174.3-dB FoM VCO-Based CT Modulator With a Fully-Digital Phase Extended Quantizer and Tri-Level Resistor DAC in 130-nm CMOS," IEEE Journal of Solid-State Circuits, vol. 52, No. 7, pp. 1940-1952, 2017.
S. Li and N. Sun, "A 174.3dB FoM VCO-Based CT ΔΣ Modulator with a FullyDigital Phase Extended Quantizer and Tri-Level Resistor DAC in 130nm CMOS," ESSCIRC, pp. 241-244, 16.10.1109/ESSCIRC.2016.7598287.
A. Sanyal and N. Sun, "A 18.5-fJ/step VCO-based 0-1 MASH ΔΣ ADC with digital background calibration," in 2016 IEEE Symposium on VLSI Circuits (VLSI-Circuits). IEEE, 2016, pp. 1-2.
Sanyal, Arindam, and Nan Sun. "An Energy-Efficient Hybrid SAR-VCO DeltaSigma Capacitance-to-Digital Converter in 40-nm CMOS." IEEE Journal of Solid-State Circuits 52.7 (2017): 1966-1976.
K. Lee, Y. Yoon, and N. Sun, "A Scaling-Friendly Low-Power Small-Area ΔΣ ADC With VCO-Based Integrator and Intrinsic Mismatch Shaping Capability," IEEE Journal on Emerging and Selected Topics in Circuits and Systems, vol. 5, No. 4, pp. 561-573, 2015.
X. Tang, S. Li, L. Shen, W. Zhao, X. Yang, R. Williams, J. Liu, Z. Tan, N. Hall, and N. Sun, "A 16fJ/Conversion-Step Time-Domain Two-Step Capacitanceto-Digital Converter," in 2019 IEEE International Solid-State Circuits Conference—(ISSCC). IEEE, 2019, pp. 296-297.
J. Steensgaard, Z. Zhang, W. Yu, A. S'arhegyi, L. Lucchese, D.-I. Kim, and G. C. Temes, "Noise-power optimization of incremental data converters," IEEE Transactions on Circuits and Systems I: Regular Papers, vol. 55, No. 5, pp. 1289-1296, 2008.
D. Ham and A. Hajimiri, "Virtual damping and Einstein relation in oscillators," IEEE Journal of Solid-State Circuits, vol. 38, No. 3, pp. 407-418, 2003.
B. Drost, M. Talegaonkar, and P. K. Hanumolu, "Analog filter design using ring oscillator integrators," IEEE Journal of Solid-State Circuits, vol. 47, No. 12, pp. 3120-3129, 2012.
S. Oh, Y. Lee, J. Wang, Z. Foo, Y. Kim, W. Jung, Z. Li, D. Blaauw, and D. Sylvester, "A dual-slope capacitance-to-digital converter integrated in an implantable pressure-sensing system," IEEE Journal of Solid-State Circuits, vol. 50, No. 7, pp. 1581-1591, 2015.
W. Jung, S. Jeong, S. Oh, D. Sylvester, and D. Blaauw, "A 0.7 pF-to-10nF fully digital capacitance-to-digital converter using itera-

(56) References Cited

OTHER PUBLICATIONS tive delay-chain discharge," in 2015 IEEE International Solid-State Circuits Conference—(ISSCC) Digest of Technical Papers. IEEE, 2015, pp. 1-3.
"Murata SCB10H datasheet," Murata Manufacturing Co., www.murata.com. 5 pages.

* cited by examiner under GR10004941 awarded by the National Science Foundation, GR10025282 awarded by the Office of Naval Research, and GR00001093 awarded by the Air Force Office of Scientific Research. The government has certain rights in the invention.

TIME-DOMAIN INCREMENTAL TWO-STEP CAPACITANCE-TO-DIGITAL CONVERTER

RELATED APPLICATION

This application claims priority to, and the benefit of, U.S. Provisional Patent Application No. 63/060,836, filed Aug. 4, 1920, entitled "Active Motion Capture Marker for Miniature Indoor Aerial Robots," which is incorporated by reference herein in its entirety.

GOVERNMENT LICENSE RIGHTS

This invention was made with government support under GR10004941 awarded by the National Science Foundation, GR10025282 awarded by the Office of Naval Research, and GR00001093 awarded by the Air Force Office of Scientific Research. The government has certain rights in the invention.

BACKGROUND

Commercial optical motion capture systems generally rely on passive markers such as reflective balls or tapes to assist in the tracking of an object's motion. Passive markers can reflect external or internal light sources back to the system's camera, allowing the software to calculate an object's position. However, both the environment and the surface of the object may also be subjected to other sources of light, reducing the motion capture system's accuracy.

More active optical motion capture systems can employ active components but are generally bulky in their implementation. In many applications, e.g., that are payload sensitive (e.g., unmanned aerial vehicles), existing optical motion capture systems do not meet the payload limitations.

There is a benefit to improving active optical motion capture systems.

SUMMARY

An exemplary motion capture system, device, and method are disclosed herein to facilitate the implementation of active marker technology onto objects and systems whose design considerations require low weight, low power usage, and/or modular implementation. The exemplary motion capture system, device, and method connect light sources with power driving components through modular, flexible strips and optimized driver circuit configuration and structure for minute unmanned or remote vehicles or wearables having very stringent design constraints.

In one embodiment, the system is implemented on a low payload aerial device such as a small aerial helicopter or drone. The helicopter or drone provides the system substrate to which the marker device including the light-emitting source components, electronic driver circuit, and flexible strip attach. The electronic drive circuit electrically couples to the light-emitting source components through the flexible strip, which additionally provides mechanical structure to attach to the aerial helicopter or drone. The modular structure and lightweight attachment allow the active market device to attach to the helicopter or drone while meeting the helicopter or drone's maximum payload requirements.

In another embodiment, the system is implemented on a wearable component for human or animal motion capture. The wearable device provides the system substrate to which the marker device, including the light-emitting source components, electronic driver circuit, and flexible strip attach. The electronic drive circuit is electrically coupled to the light-emitting source components through the flexible strip, which additionally provides a mechanical structure to attach to the wearable component. The modular structure and lightweight attachment provide an unencumbering means of human or animal motion capture.

In an aspect, an exemplary system is disclosed comprising a system substrate, (e.g., unmanned vehicle, e.g., blimp; wearable device for motion capture); an active motion capture marker device (e.g., an ultra-light weight device) operatively coupled to the system substrate (e.g., via adhesives), the active motion capture marker device comprising: a plurality of light emitting source components (e.g., IR, visible, and/or UV sources), including a first light emitting source component and a second light emitting source component; a electronic driver circuit (e.g., comprising DC-DC step-up converter) configured to energize the plurality of light emitting source components; and one or more flexible strip that couple to the electronic driver circuit, including a first flexible strip, the first flexible strip comprising a flexible substrate having a length and a conductor formed thereon that extends along the length of the flexible substrate, wherein the first light emitting source component is electrically coupled to the first flexible strip at a first position (e.g., at a corner region of the first flexible strip), and wherein the second light emitting source component is electrically coupled to the first flexible strip at a second position (e.g., at an end region of the first flexible strip).

In some embodiments, the electronic driver circuit comprises a current-controlled output circuit (e.g., to provide consistent brightness output of the plurality of light emitting source components).

In some embodiments, the electronic driver circuit comprises a linear regulator, a charge pump, or a DC-DC converter.

In some embodiments, the electronic driver circuit is connected to the plurality of light emitting source components (e.g., wherein the plurality of light emitting source components are connected in series).

In some embodiments, the plurality of light emitting source components comprise infrared light emitting diodes (e.g., IR LED, visible LED, UV LED, or a combination thereof).

In some embodiments, the system further includes a modular flexible strip that electrically couples to the electronic driver circuit, the modular flexible strip comprising a flexible substrate having a length and a conductor formed thereon that extends along the length of the flexible substrate, wherein a light emitting source component of the plurality of light emitting source components is electrically coupled to the conductor of said modular flexible strip at a first position (e.g., at a corner region of said modular flexible strip), and wherein a second light emitting source component of the plurality of light emitting source components is electrically coupled to the conductor of a second flexible strip at a second position (e.g., at an end region of the first flexible strip).

In some embodiments, the first position for the first light emitting source component, the second position for the second light emitting source component, are located asymmetrically with respect to one another.

In some embodiments, the one or more modular flexible strip comprises a first set of one or more layers comprising a flexible printed circuit (FPC) (e.g., a flexible flat cable (e.g., comprising polyester film), single-sided flex circuits, double-sided flex circuits; and multilayer flex circuits); and a second layer comprising the connector; a connector coupled to the connector of the second layer.

In some embodiments, each of the one or more flexible strips are fixably coupled (e.g., adhesively coupled) to the system substrate (e.g., via adhesives, hook and lock, sewings).

In some embodiments, the active emotion capture system comprises a power source comprising one or more energy storage device (e.g., electrical energy storage/batteries).

In some embodiments, the active motion capture system comprises a power source comprising an energy harvesting device (e.g., photovoltaic device, mechanical energy harvester component, vibration energy harvesting component).

In some embodiments, the active motion capture system comprises a power source comprising an external power source In some embodiments, the active motion capture system comprises a localization system comprising: a plurality of localization cameras, including a first camera and a second camera; and a localization controller operatively coupled to said first and second cameras, the localization having a processor and a memory having instructions stored thereon, wherein execution of the instructions by the processor cause the processor to: receive first video data and second video data from the first camera and the second camera, respectively; identify the plurality of light emitting source components of the active motion capture marker device using the first and second video data; determine a location of an object having the active motion capture marker device affixed thereto using the identified plurality of light emitting source components.

In some embodiments, the one or more flexible strip are reflective, and wherein the localization system further comprises a plurality of external illumination lamps, wherein said plurality of external illumination lamps are attached to said plurality external localization cameras and emitting light at a wavelength overlapping that of said plurality of light emitting source components.

In some embodiments, one or more of the plurality of external localization cameras are attached to an external movable object wherein said external movable object are configured to move in relation to the active motion capture marker device.

In some embodiments, the active motion capture system further comprises an unmanned vehicle (e.g., autonomous unmanned vehicle) comprising the system substrate.

In some embodiments, the active motion capture system further comprises a motion tracking garment having at least one of a shoulder section, a knee section, and an elbow section, wherein the active motion capture marker device is coupled to the motion tracking garment, and wherein the plurality of light emitting source components are coupled to the at least one of the shoulder section, the knee section, and the elbow section.

In another aspect, an active motion capture marker device is disclosed which is operatively coupled to the system substrate (e.g., via adhesives), the active motion capture marker device comprising a plurality of light emitting source components (e.g., IR, visible, and/or UV sources), including a first light emitting source component and a second light emitting source component, a electronic driver circuit (e.g., comprising DC-DC step-up converter) configured to energize the plurality of light emitting source components, and one or more flexible strip that couple to the electronic driver circuit, including a first flexible strip, the first flexible strip comprising a flexible substrate having a length and a conductor formed thereon that extends along the length of the flexible substrate, wherein the first light emitting source component is electrically coupled to the first flexible strip at a first position (e.g., at a corner region of the first flexible strip), and wherein the second light emitting source component is electrically coupled to the first flexible strip at a second position (e.g., at an end region of the first flexible strip).

In some embodiments, the electronic driver circuit comprises a current-controlled output circuit (e.g., to provide consistent brightness output of the plurality of light emitting source components) and a DC-DC converter (e.g., step-up converter) operatively coupled to the current-controlled output circuit, the DC-DC converter to output a voltage output to the current-controlled output circuit.

In some embodiments, the electronic driver circuit is connected to said plurality of light emitting source components (e.g., wherein the plurality of light emitting source components are connected in series or in parallel configuration).

In some embodiments, the plurality of light emitting source components comprise infrared light emitting diodes (e.g., IR LED, visible LED, UV LED, or a combination thereof).

In another aspect, a method to install an active motion capture marker device on an object is disclosed, the method comprising providing an object comprising a plurality of illuminating locations (e.g., a localization or motion capture system); providing an active motion capture marker device (e.g., an ultra-light weight device) configured to be operatively coupled to the object (e.g., via adhesives), wherein the active motion capture marker device comprises a plurality of light emitting source components (e.g., IR, visible, and/or UV sources), including a first light emitting source component and a second light emitting source component; a electronic driver circuit (e.g., comprising DC-DC step-up converter) configured to energize the plurality of light emitting source components; and one or more flexible strip that couple to the electronic driver circuit, including a first flexible strip, the first flexible strip comprising a flexible substrate having a length and a conductor formed thereon that extends along the length of the flexible substrate, wherein the first light emitting source component is electrically coupled to the first flexible strip at a first position (e.g., at a corner region of the first flexible strip), and wherein the second light emitting source component is electrically coupled to the first flexible strip at a second position (e.g., at an end region of the first flexible strip); affixing (e.g., via adhesives of active motion capture marker device or external adhesives) the electronic driver circuit to the object at a first mounting location; and affixing (e.g., via adhesives of active motion capture marker device or external adhesives) the first flexible strip to the object along a second mounting location, including at a first illumination location and a second illumination location, wherein the first illumination location corresponds to the first location of the first light emitting source component, and wherein the second illumination location corresponds to the second location of the second light emitting source component.

In some embodiments, the method of installing the device on an object further comprises receiving, from a first camera and a second camera, data from the light-emitting source components; identifying, with a processor, the plurality of light-emitting source components of the active motion capture marker device using the first and second video data; and determining a location of an object having the active motion capture marker device affixed thereto using the identified plurality of light-emitting source components.

BRIEF DESCRIPTION OF THE DRAWINGS

The accompanying drawings, which are incorporated in and constitute a part of this specification, illustrate embodiments and, together with the description, serve to explain the principles of the methods and systems.

DETAILED SPECIFICATION

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n]" corresponds to the nth reference in the reference list. For example, Ref. [1] refers to the 1st reference in the list. All references cited and discussed in this specification are incorporated herein by reference in their entireties and to the same extent as if each reference was individually incorporated by reference.

Example Active Marker Capture Device

Figure 1:
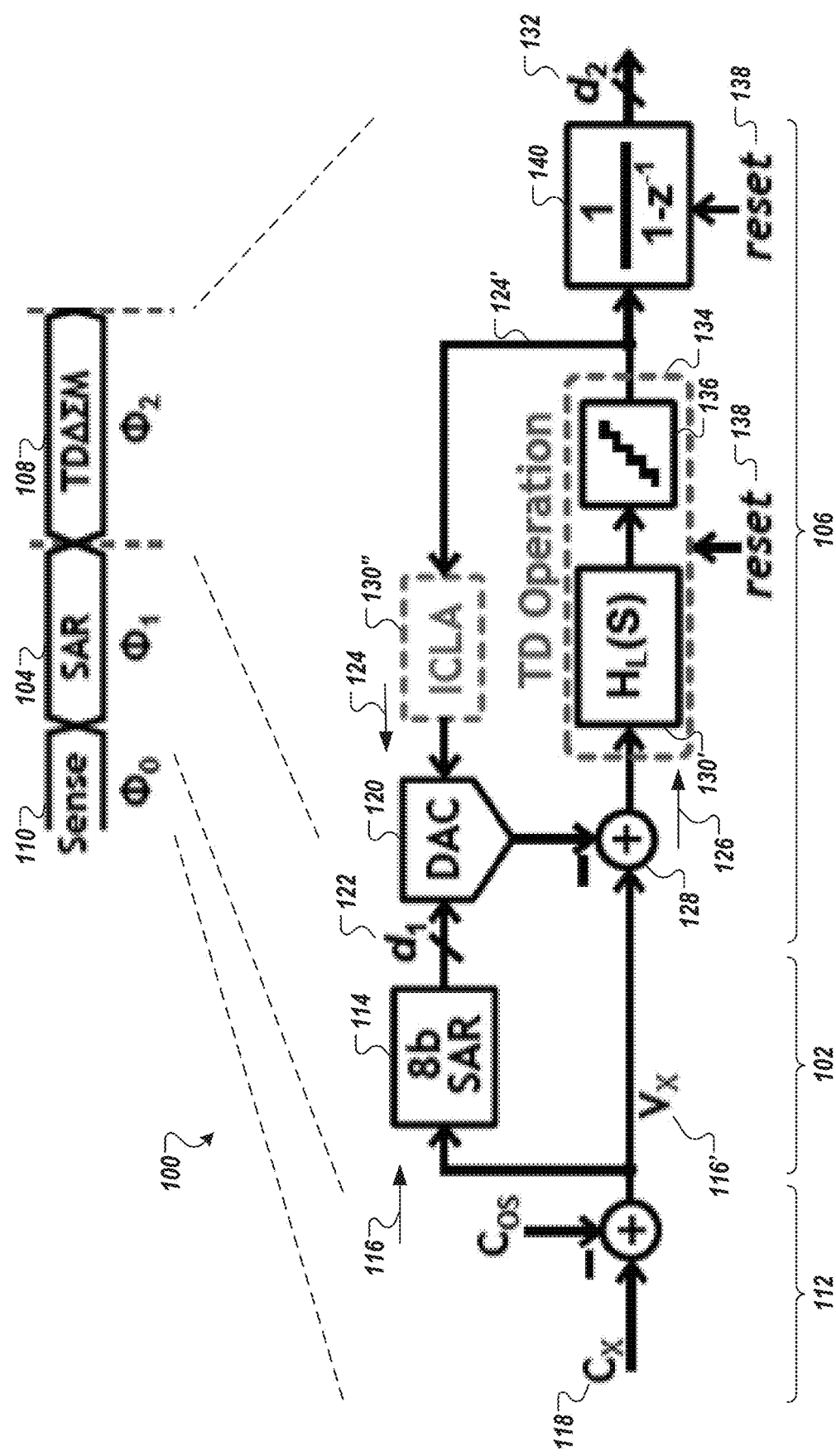
FIG. 1 shows an active motion capture marker system that includes a lightweight active marker capture device operatively coupled to a system to be tracked in accordance with an illustrative embodiment.

FIG. 1 shows an active motion capture marker system 100 that includes a lightweight active marker capture device 102 operatively coupled 112 (e.g., adhesively) to a system substrate 104. The active marker capture device 102 includes an electronic driver circuit 106 that is electrically coupled to a power source 107 and is also electrically coupled to a plurality of light-emitting source components 108a, 108b. Device 102 includes one or more flexible connections 110a and 110b that each couple to light-emitting source components 108 (shown in this example as 108a and 108b).

The one or more flexible strips 110a, 110b provide lightweight, self-encapsulated electrical coupling between the electronic driver circuit 106 and the plurality of light-emitting source components (e.g., 108a, 108b). The flexible strips 110a, 110b can also serve as a substrate/carrier for the active light-emitting source components (e.g., 108a, 108b). The electrical coupling is formed by one or more printed conductors that extend the length of the one or more flexible strip 110a, 110b. The one or more modular flexible strips additionally provide mechanical support over its wide surface area to adhere to the system substrate 104 for the active marker capture device 102 to couple to the system substrate 104. In some embodiments, the one or more flexible strip includes flexible, bendable circuit boards (also referred to as flexible flat cable) comprising a flexible plastic substrate made, e.g., of polyimide film or polyester film. The flexible strips can be single-sided, double access, double-sided, multilayer, rigid-flex, and polymer thick film flex circuits. Flexible strips 110a, 110b may be adhered, via adhesives (shown as 112), to the system substrate 104. Other means of attachment may be used, e.g., hoop and loop connections, sewing, etc.

The system substrate 104 can be a part of a small unmanned aerial vehicles (UAVs), autonomous mobile robots, wearable garments, signage, e.g., for human or animal motion capture, or any object or system to which a marker can be attached to assist in the tracking of the object's motion or for localization. Example of vehicles includes blimps, drones. The system substrate comprises a surface 114 to which the active marker capture device 102 attaches.

The driver circuit 106 is configured to energize the plurality of light emitting source components (e.g., 108a, 108b). The plurality of light-emitting source components may emit light on the infrared (IR), visible, and/or ultraviolet (UV) spectrums. In the example shown in FIG. 1, the electronic driver circuit 102 can be a constant voltage drive or constant current drive device that can employ the power source 107 of the system 109. In some embodiments, linear regulators, charge pumps, DC-DC converters can be employed for the electronic driver circuit 102. In other embodiments, constant current devices such as DC-DC Boost converter can be used.

In some embodiments, active marker capture device 102 can include its own local power source or energy harvesting device (not shown), e.g., light-weight photovoltaic (PV) device, or a lightweight mechanical or vibration energy harvesting device.

Example #1

Figure 2A:
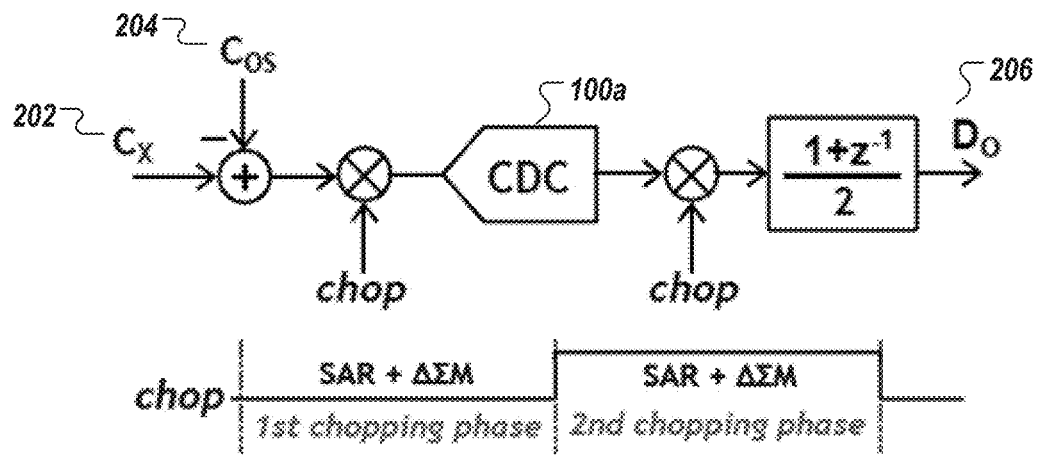
FIG. 2A shows an example implementation of the active motion capture marker device of FIG. 1 that can be readily attached to a system of interest for motion capture or localization in accordance with an illustrative embodiment.

FIG. 2A shows an example implementation of the active motion capture marker device 102 (shown as 200) of FIG. 1 that can be readily attached to a system of interest for motion capture or localization. The active motion capture marker device includes multiple light-emitting source components 108 (shown as 108a', 108b', 108c', and 108d') that are asymmetrically spaced apart over a wide area of the system (e.g., 107—see FIG. 1) to facilitate quick and readily identifiable orientation and/or identification of the active motion capture marker device 200 (and hence the identification and orientation of the underlying system).

Device 200 includes a lightweight, flexible strip 110 (shown as 110a') that provide electrical routing of the light-emitting source components 108a', 108b', 108c', 108d' (positioned at distinct regions of the system at locations 204, 206, 208, and 210, respectively) over a wide area and space of the system substrate (e.g., 104). The flexible strip 110 terminates with a connector 202 that connects to the driver circuit 106 (shown as 106').

In the example shown in FIG. 2A, flexible strip 110a' includes three layers: a bottom layer, a middle layer, and a top layer. The bottom layer is connected to a connector 202 to provide mechanical and electrical coupling to the electronic driver circuit 106'. The bottom layer can be glued, attached, or sewed (e.g., via adhesive 112 or other means described herein) to the system substrate. The middle layer provides structural support to the device 200 and conductors to connect the output of the drive electronic circuit 106' to the light-emitting source components (e.g., 108a' 108b' 108c' 108d'). The top layer provides encapsulation to protect the conductors in the middle layer and can be connected to a stiffener 203, e.g., at the connection point to the connector 202. The stiffener 204 stiffens the flexible strip at the connection location to facilitate installation of the flexible strip 110a' to the active drive circuit 106' and to reduce cable strain at the connection region.

Example Driver Circuit

Figure 2B:
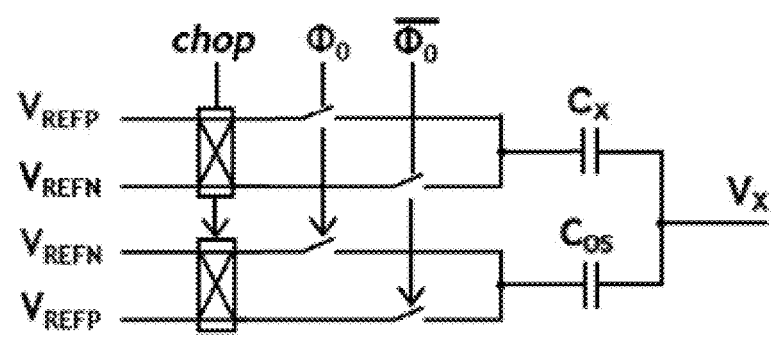
FIGS. 2B and 2C show circuit diagrams of an example optimally-sized and wight electronic driver circuit in accordance with an illustrative embodiment.
Figure 2C:
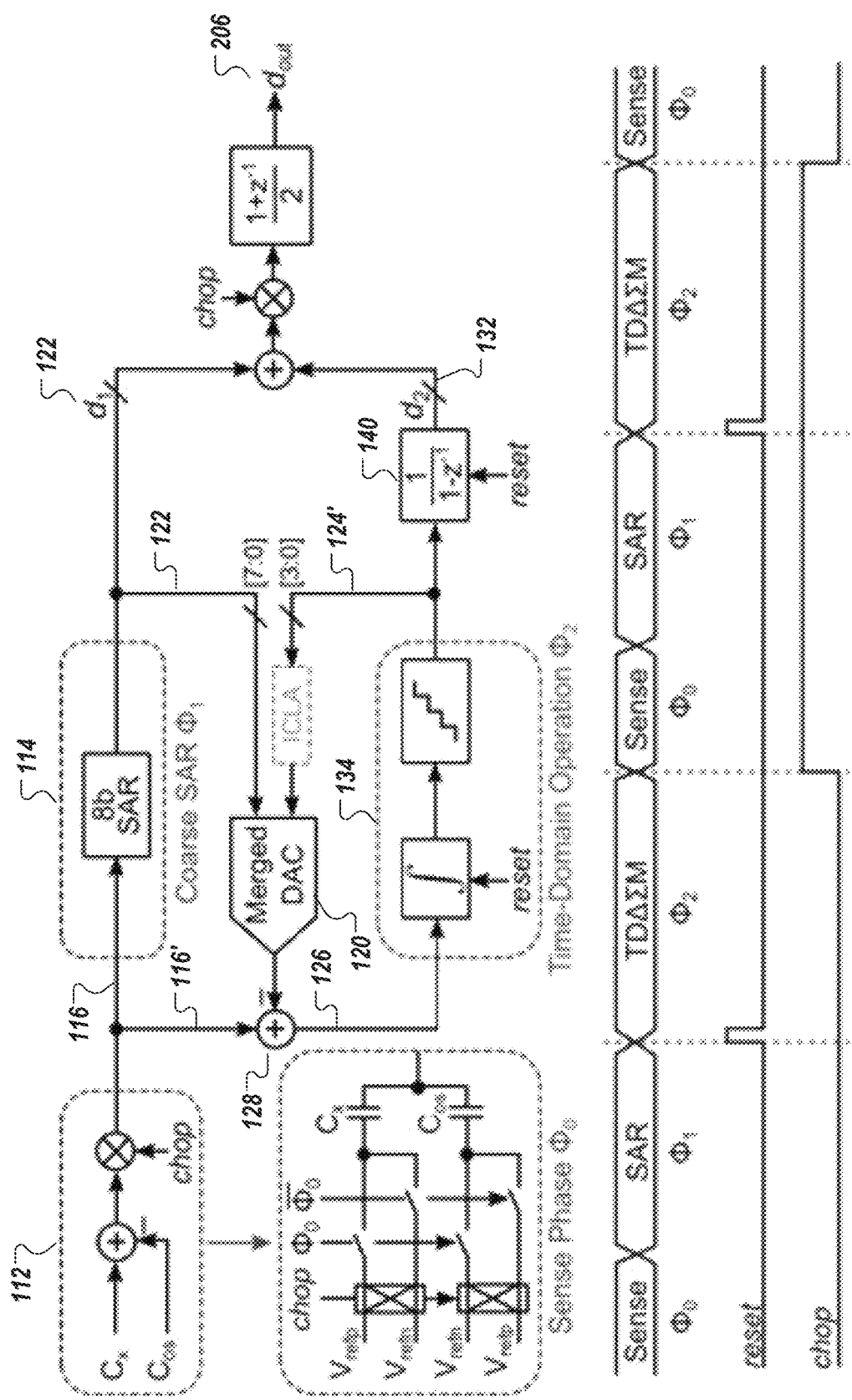

FIGS. 2B and 2C show circuit diagrams of an example optimally-sized and wight electronic driver circuit 106 (shown as 106'). As shown in FIGS. 2B and 2C, the electronic driver circuit includes a minimal set of integrated components to be compact, lightweight that is centrally designed around a single driver IC 212 that drives the light-emitting source components 108 via a constant DC output at 29 VDC at 30 mA using external power provided by the system (e.g., 109). The configuration provides minimize luminance variance of the LED output as well as minimize voltage requirements.

An example of the driver IC is a power diode boost converter, part no. TPS6115 that is manufactured by Texas Instruments having a WSON package. In FIG. 2B, the driver IC 212 is connected to a first connector 216 (e.g., BM02B-ACHLKS-GAN-ETF) that connects to the external power source 107 (shown as 107') and a second connector 214 that connects to the flex strip. In FIG. 2C, the connector 214 is shown connected to four LEDs (shown as "D1" 108a', "D2" 108b', "D3" 108c', and "D4" 108d' in series. Other configurations may nevertheless be used (e.g., parallel connection or combination thereof).

Example Localization and/or Motion Tracking System #1

FIG. 3A shows an example localization and/or motion tracking system 300 that can operate with the active motion capture device 102 (shown as 102") coupled to an unmanned aerial vehicle. Specifically, FIG. 3A shows an indoor testing and development facilities (e.g., in a warehouse) for testing unmanned aerial vehicles (UAVs) and algorithms for UAVs in a GPS denied environment having a ceiling installed testbed gantry 304 coupled with a plurality of cameras 306 (shown as 306a, 306b, 306c) and illumination lamp 308. The indoor testing and development facilities may be an open atrium. In some embodiments, the indoor testing facilities can include barriers, internal walls, internal ceilings that can facilitate certain test and evaluations of UAVs.

In the example shown in FIG. 3A, the localization and/or motion tracking system 300 includes a controller 302 that receives the video stream from the cameras 306. Controller 302 receives orientation and position information of the UAV 104' via the active motion capture device 102" from cameras 306. A processor of the controller 302 uses the camera feed to determine the location, orientation, speed, acceleration of the UAV 104'.

In FIG. 3A the active motion capture device 102" is coupled to an unmanned aerial vehicle or blimp (shown as "Unmanned Aerial Vehicle #1" 104'). The system 104' is shown to include a local controller 310 to execute instructions for test algorithm 312 that controls steering of the system 104' using sensors 314 (shown as "Camera" 314). The localization and motion tracking system 300 can be used to evaluate the performance of the test algorithm 312 as well as the design and configuration of the UAV system 104'.

In the example shown in FIG. 3A, the testbed gantry 304 is affixed to a ceiling of the infrastructure. In certain embodiments, cameras may be mounted on walls of the structure as well as moving gantries 318 (shown as "Unmanned Aerial Vehicle #2" 318). The moving gantry system 318 includes cameras for its movement as well as for localization and motion tracking of the UAV 104'. The controller 302 may provide, in some implementation, localization and/or telemetry information to the controller 302 of the UAV 104'.

Example Localization and/or Motion Tracking System #2

FIGS. 3B and 3C show an example localization and/or motion tracking system 350 for human motion capture. In FIG. 3B, a wearable motion tracking garment 352 is with an active motion capture device 200 affixed to it. The embodiment shown in FIG. 3B shows the ease of use and portability of the active motion capture system 100.

In the example shown in FIG. 3B, the active motion capture device 200 is use for safety as visible marker to enhance the visibility of a person.

FIG. 3C shows another implementation of the active motion capture device 200 that is incorporated into a motion capture body suit. In the example shown in FIG. 3C, the active driver circuit 106 (shown as 106") is located centrally on a person's torso. The light-source emitting components 108 (shown as 302) are provided at landmark locations on a person such as the elbows, knees, ankles, and other body pivot points. The lightweight configuration, lower power operation, ruggedized form factor, and modularity can also provide flexibility and movement for a wide range of body movements. The motion capture can be used to evaluate fatigue, repetitive movements. The active motion capture device 200 can be adapted for placement on motion suits for animals.

Robotics: The active marker can be conveniently integrated with a wide variety of robots using optical motion capture systems. Both accuracy and reliability of the localization can be improved with the deployment of the exemplary active marker design. The weight of the active marker is usually a few times less than that of the passive markers, making this device favorable to small-sized robots with limited payload.

Virtual Reality (VR): The active marker can also be easily integrated with head mounted display (HMD), or function as a wearable device to identify the position and pose of the user. More immersive VR experience can be achieved with the pose of the user, HMD, and other scene elements being tracked in real time.

Biomechanics Measurement: With light weight tape-like flexible design, the active marker can be conveniently instrumented on human or animal. Movements of interest such as a subject's walking gait can be analyzed for research, sports coaching, or rehabilitation.

Experimental Results and Examples

A study was conducted to evaluate new algorithms for an unmanned vehicle.

Miniature indoor aerial robots usually use optical motion capture systems to obtain their position and attitude due to the GPS-denied environment. These systems typically incorporate multiple ceiling-mounted infrared cameras to track the reflective markers installed on the robots. Multiple infrared lamps are required to illuminate the capture volume, ensuring the visibility of the reflective markers to the motion capture cameras. However, the environment and the surface of the robot may also reflect the infrared illumination in addition to the markers. This undesirable reflection causes interference to the motion capture system, and impacts both the accuracy and reliability of the measurement. Because of such poor tracking of the unmanned vehicle, an active marker capture device (e.g., 102) was developed that is lightweight, portable, and modular.

The exemplary active positioning marker is disclosed that eliminates the requirement for external infrared illumination and thus also eliminates interference due to the excess reflection from the external illumination. The exemplary active marker incorporates the flexible circuit technology, which allows the device to be installed on robots with a wide variety of shapes. The flexible marker also has an adhesive backing, providing reliable attachment to the host robot while simplifying the installation. The marker consumes very small amounts of energy, and can be neglected for most robotic systems. The total weight of the active marker is roughly one gram, which is typically a few times lighter than that of the passive markers. The reduced weight fraction of the marker enlarges the payload capability of the aerial robots.

Figure 4:
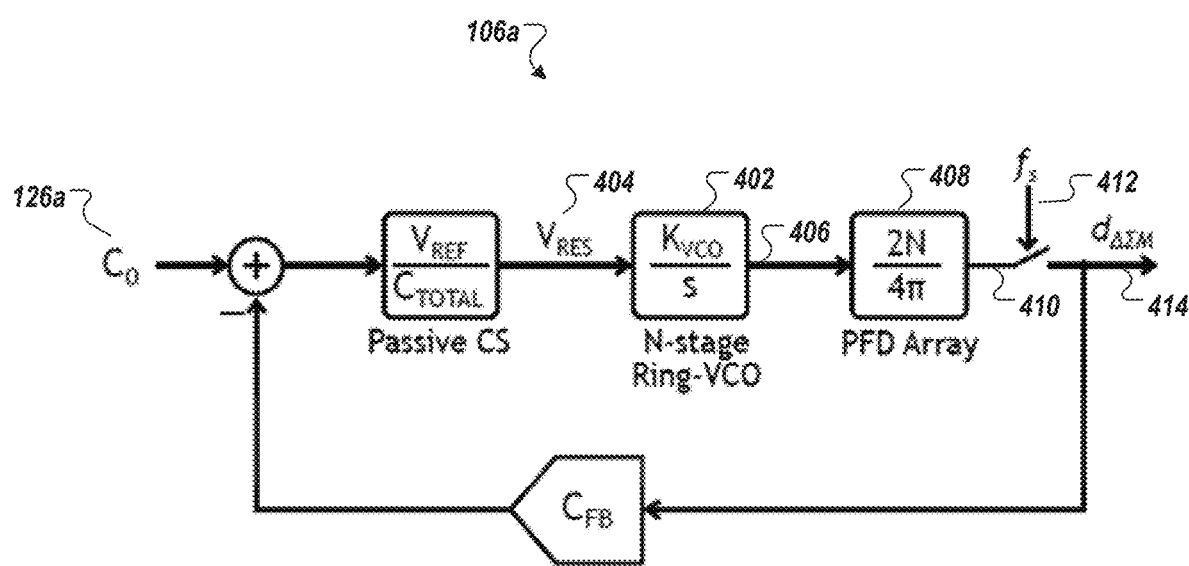
FIG. 4 shows an example indoor testing and development facilities for an unmanned indoor aerial robot that was used in the study.

FIG. 4 shows an example indoor testing and development facilities 400 for an unmanned indoor aerial robot 402 that was used in the study. The indoor aerial robot 402 was originally configured with a passive reflective marks. The test gantry 404 includes a number of localization cameras 406 and infrared illumination lamps 408. The lamps 408 can emit light on both the passive reflective markers. Indoor aerial robot 402 is a test vehicle that can be used to evaluate new controls and algorithms for unmanned vehicles.

Figure 5:
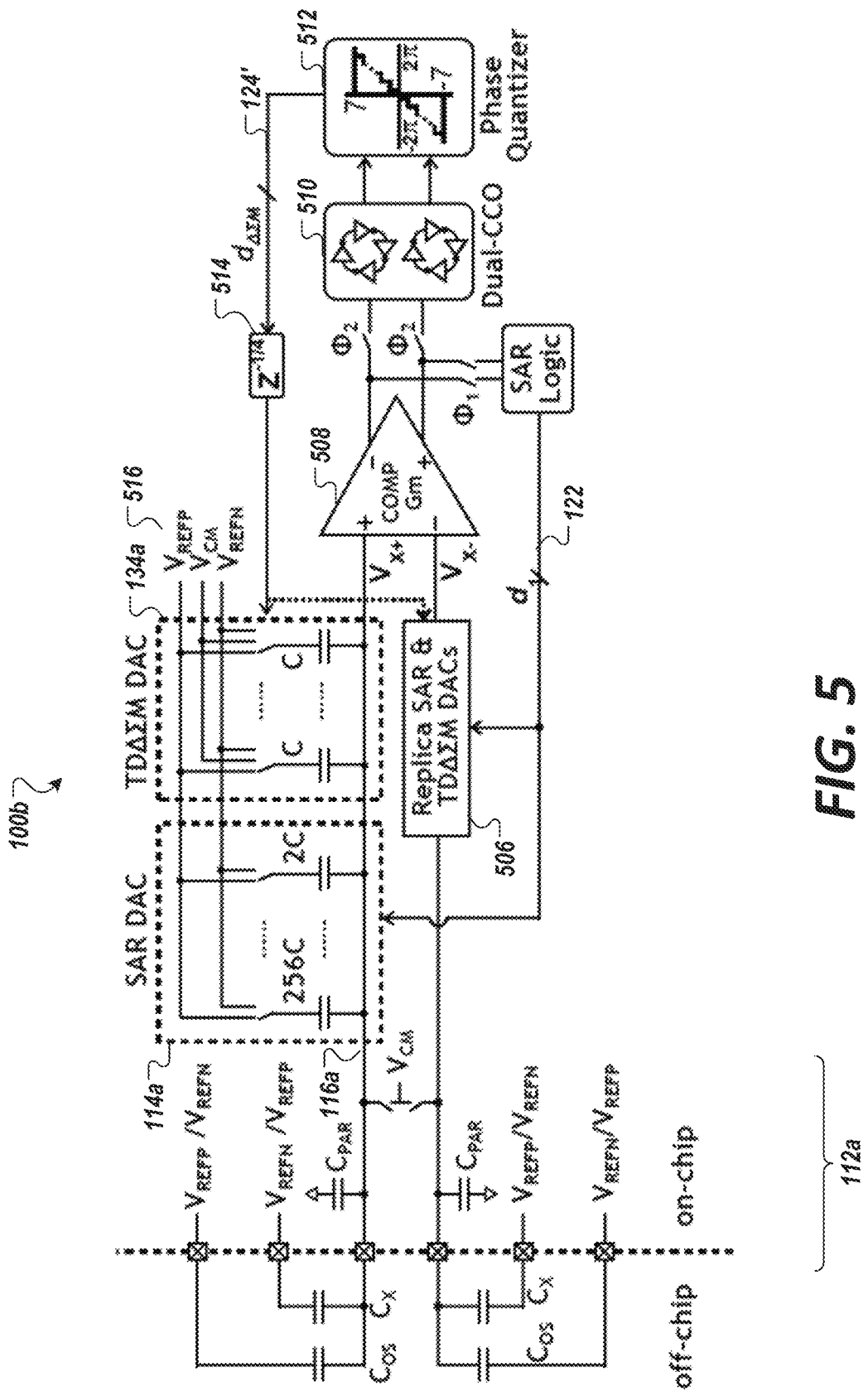
FIG. 5A shows a configuration of the active marker capture device as installed on the indoor aerial.
FIGS. 5B, 5C, and 5D shows an example implementation of the active marker capture device.

To address the poor tracking by the localization and motion tracking system of the indoor testing and development facilities 400, the indoor aerial robot 402 was retrofitted with active marker capture device (e.g., 102). FIG. 5A shows a configuration of the active marker capture device (e.g., 102) (shown as 502) as installed on the indoor aerial robot 402. The active marker capture device 502 includes a drive circuit 106', flexible strip 110a', and light-emitting source components 108a', 108b', 108c', 108d' as described in relation to FIG. 2. Mini-LEDs were employed (as 108) for precise tracking. Light spot of a mini-LED is observed to be only a few pixels in diameter as observed through an OptiTrack's camera system.

FIGS. 5B, 5C, and 5D shows an example implementation of the active marker capture device 502.

In FIG. 5B, the flexible strip 110a' is shown configured with back-sided adhesives. The illumination stripe provides both a mechanical support for the infrared LEDs, and an electrical connection between the LEDs and driver circuit.

The four infrared LEDs emit light at the same wavelength as the external illumination lamp, which ensures their visibility to the motion capture cameras. The LEDs are interconnected in series to minimize the luminance variance between individual components. The LEDs are located asymmetrically at the corners of the stripe, allowing the motion capture system to identify the attitude of the robot in 3D space. The shape and the dimension of the stripe can also be customized for different robots. Total power consumption of the LEDs are approximately 0.1 watts, which can be neglected for most robotic systems. A connector is located at the back side of the stripe that provides convenient electrical connection to the driver circuit.

Figure 3:
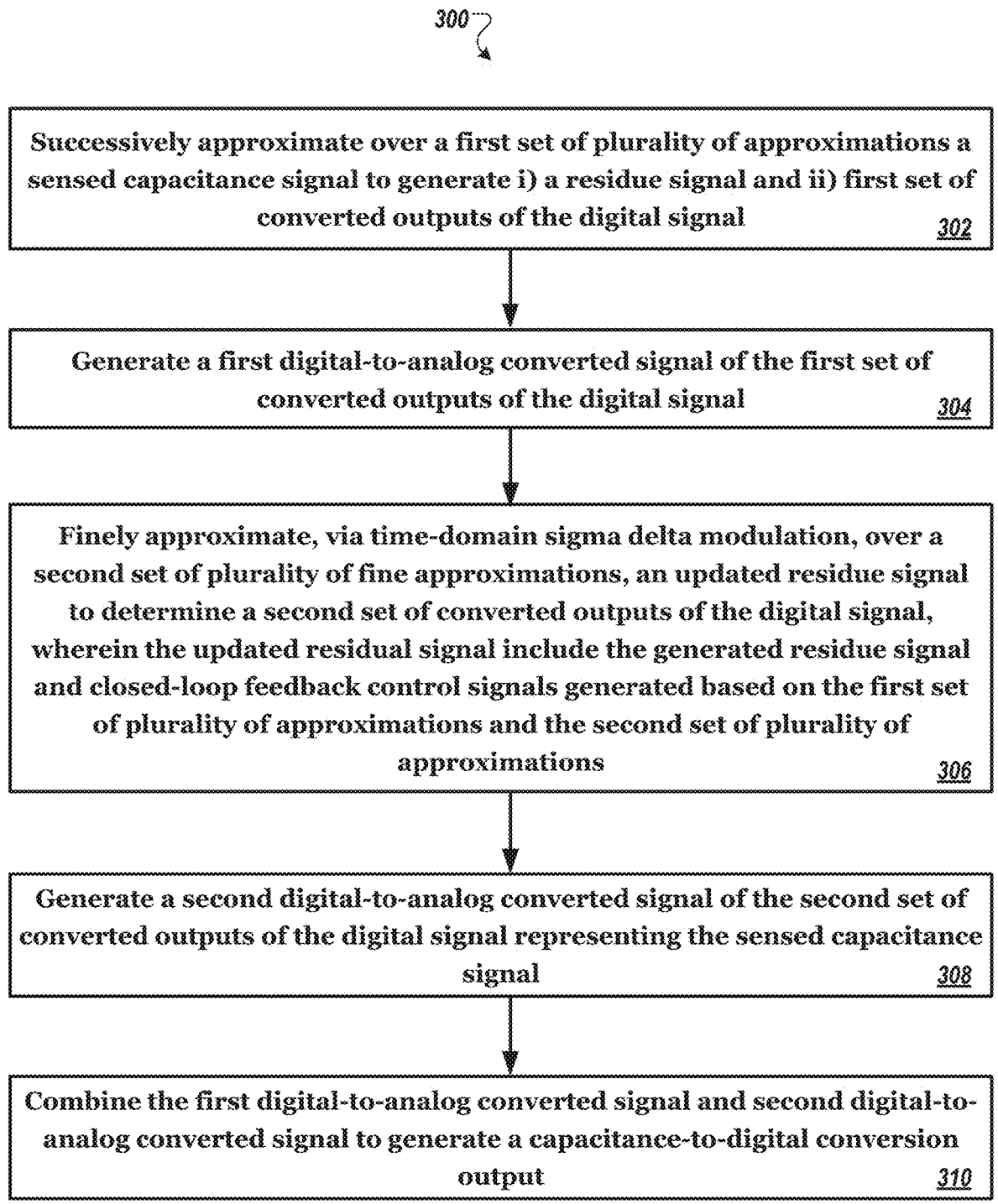
FIG. 3A shows an example localization and/or motion tracking system that can operate with the active motion capture device coupled to an unmanned aerial vehicle.
FIGS. 3B and 3C show an example localization and/or motion tracking system 350 for human motion capture.

The stripe is built upon a flexible substrate, which allows the device to be installed on robots with a wide variety of shapes. As shown in FIG. 3, there is adhesive on the back side of the stripe, providing reliable attachment to the host robot while simplifies the installation. The weight of the illumination stripe is approximately 0.7 grams, which is significantly lighter than existing active markers, and is a fraction of most passive markers. This lightweight marker helps enlarge the payload capability of the host robots.

In FIG. 5C, the scale of the driver circuit is shown in relation to a quarter. The driver circuit powers the infrared LEDs on the illumination stripe at the designated current. The constant-current design ensures the consistent brightness throughout a wide range of input voltages. The power supply of the driver can either come from the host robot or from a standalone battery. Since the series-connected LEDs requires higher voltage, we incorporate DC-DC step-up converter for abundant voltage with high efficiency.

As shown in FIG. 5B, the illumination stripe can be conveniently connected to the driver with an electrical connector. There is a second connector on the driver which provides power to the device. The total area of the driver is approximately 1.2 $cm^2$ and the total weight is about 0.3 grams. The reduced dimension and weight allows the entire system can be easily integrated on miniature aerial robots with limited payload capacity. The overall weight of the active marker is usually lighter than that of passive markers.

FIG. 5D shows example dimensions for the flexible strip 110a'. FIG. 5D shows the dimensions and a specific embodiment of the one or more flexible strip and connector. As illustrated in FIG. 5D, the entire system can consist of a flexible illumination stripe, and a compact driver circuit. As shown, there are four small-sized infrared LEDs integrated at the corners of the illumination stripe.

Figure 6:
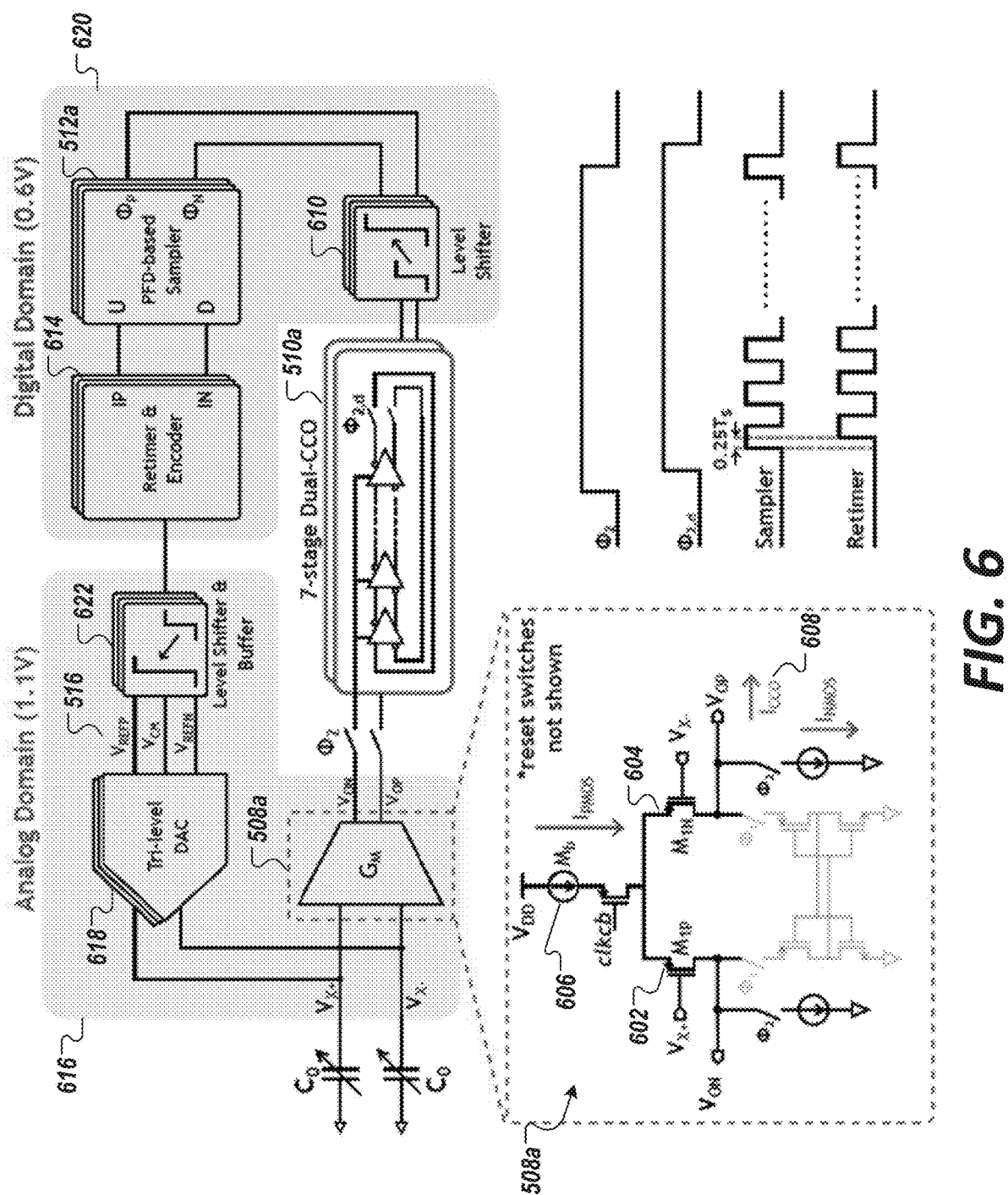
FIGS. 6A, 6B, 6C, and 6D show experimental results indicating the performance of the active marker capture device.

FIGS. 6A, 6B, 6C, and 6D show experimental results indicating the performance of the active marker capture device 502. Specifically, FIGS. 6A and 6B show the baseline results for the indoor aerial robot 402 of FIG. 4 configured with passive markers. Reflection from the envelope is observed to be stronger in the infrared spectrum than that from the passive markers. FIGS. 6C and 6D shows the same indoor aerial robot 402 of FIG. 4 configured with the active marker capture device 502. Only the active markers (via IR imaging) are visible to the OptiTrack system.

It can be observed in FIG. 6B that the passive marker system produces undesired reflection from the surface of the system substrate. The reflective surface of the indoor aerial robot 402 obfuscate the markers that are employed for localization and tracking. In FIG. 6D, it is observed that the infrared LEDs of the active marker capture device 502 are the only objects that are observed by the infrared camera of the indoor testing and development facilities 400.

Figure 7:
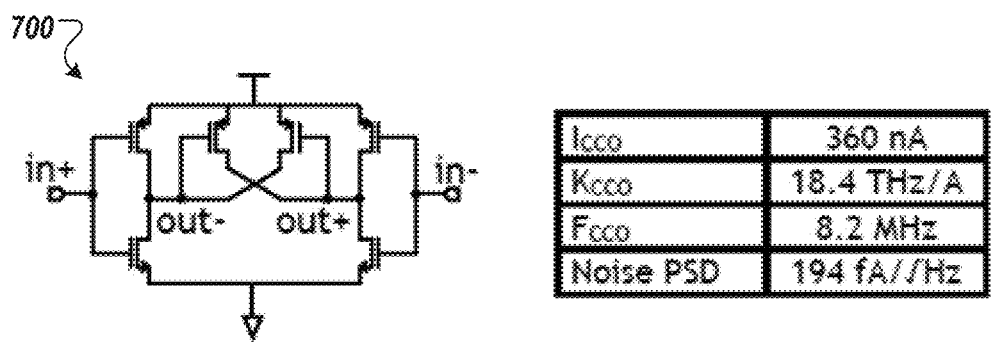
FIGS. 7A and 7B provide experimental results of a localization and motion tracking application.
Figure 8:
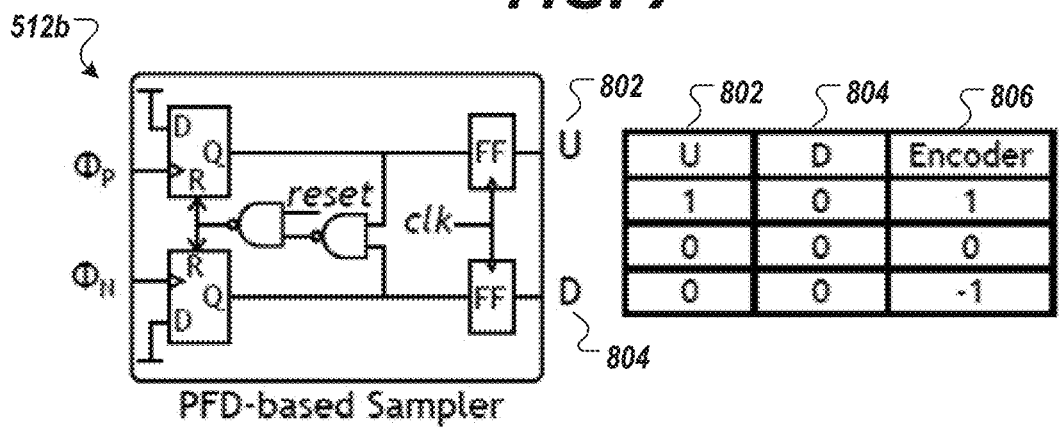
Figure 9A:
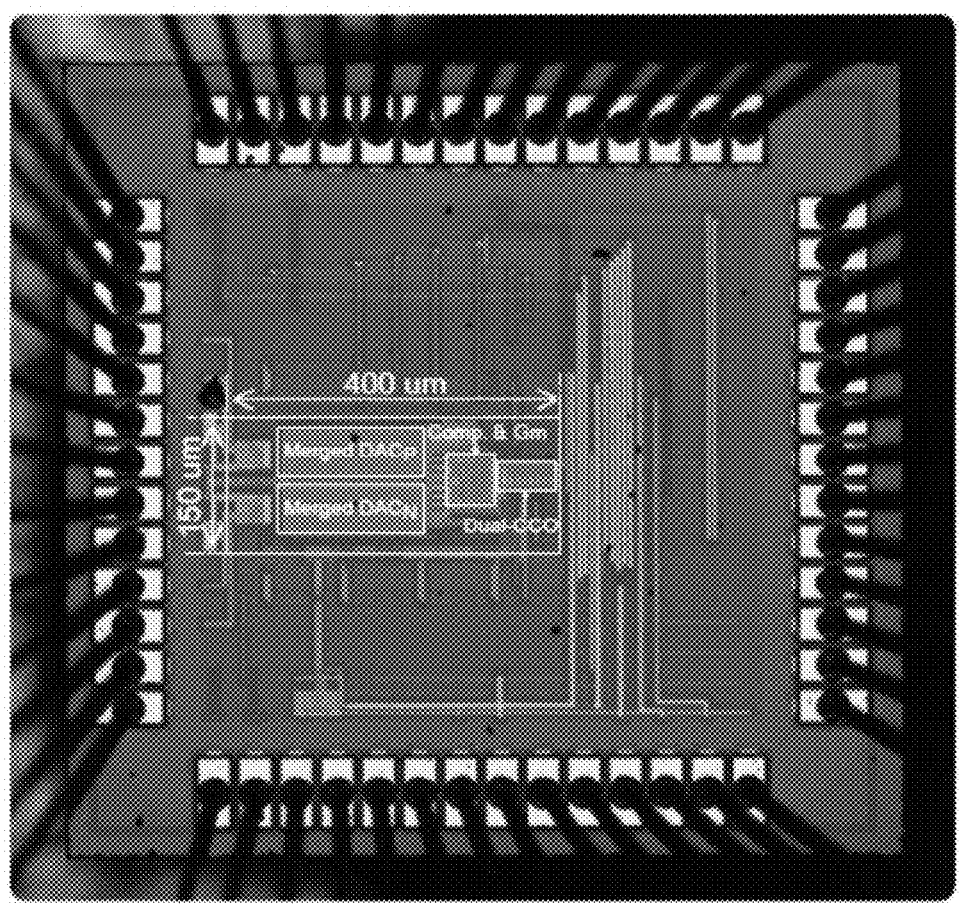
Figure 9B:
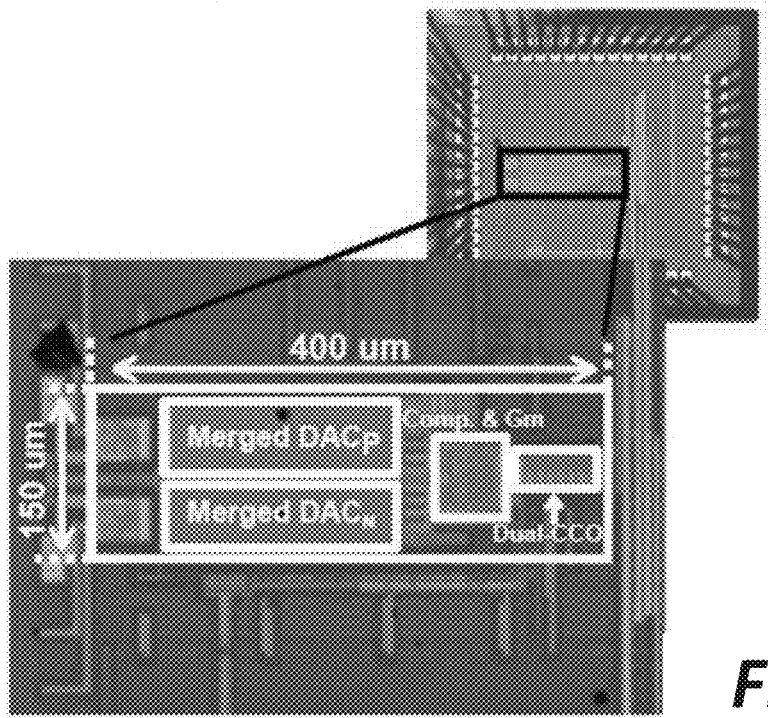
Figure 10:
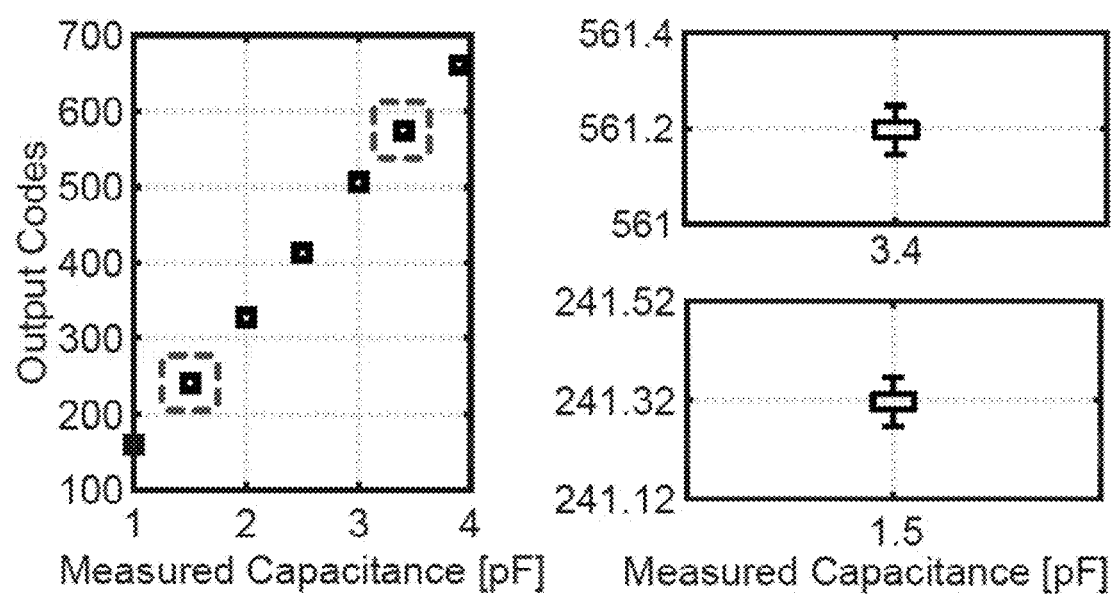
Figure 11:
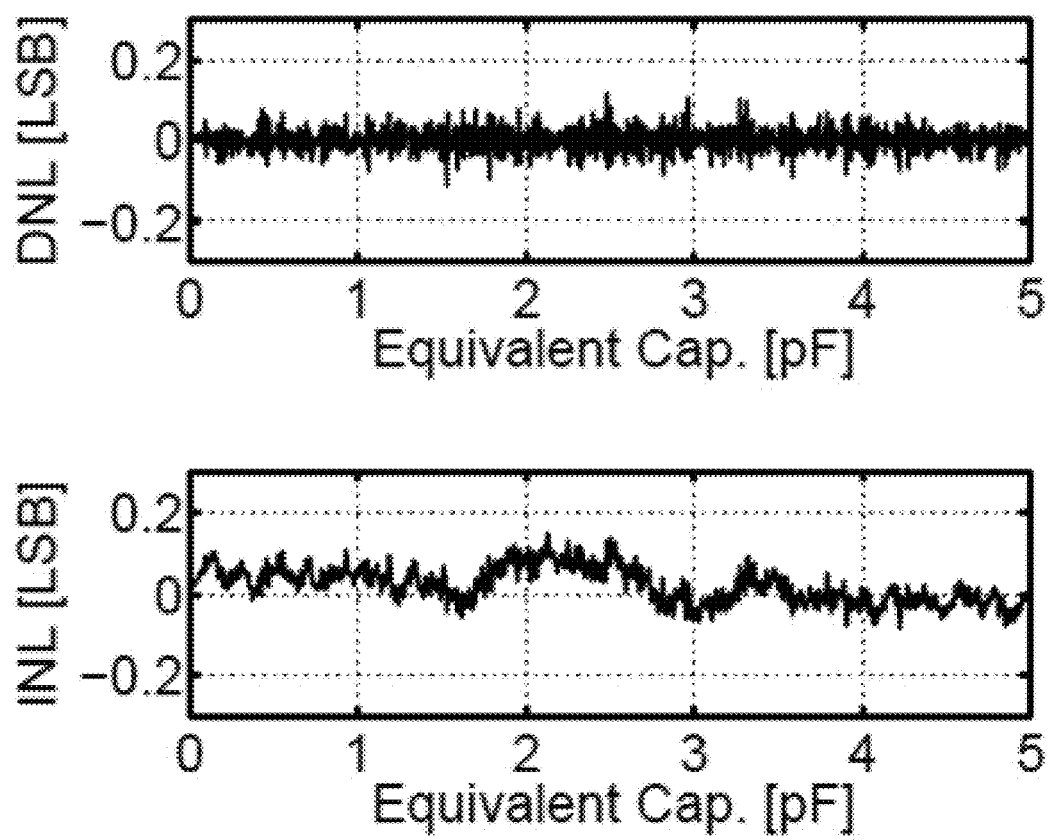
Figure 12:
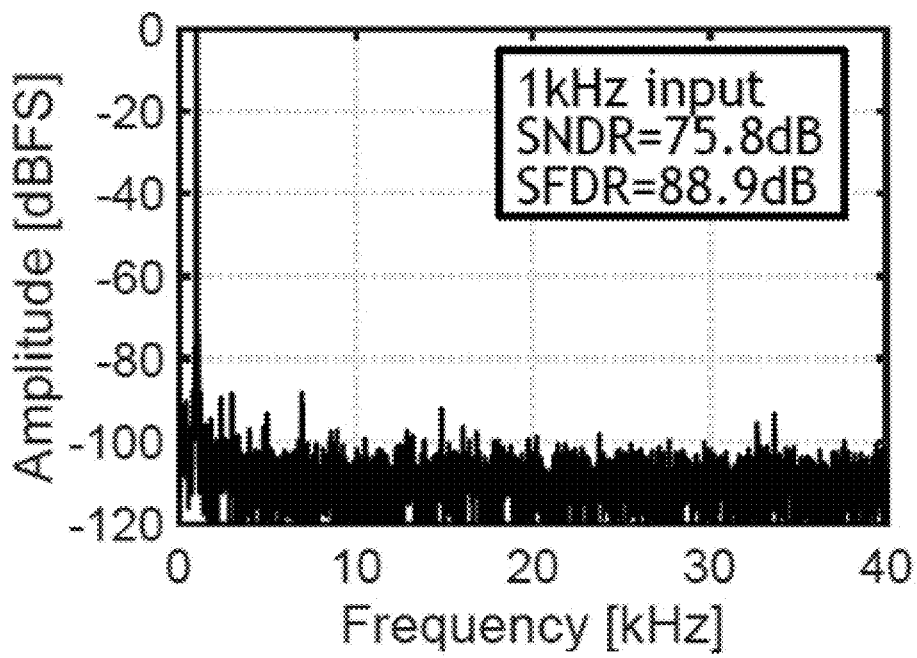
Figure 13:
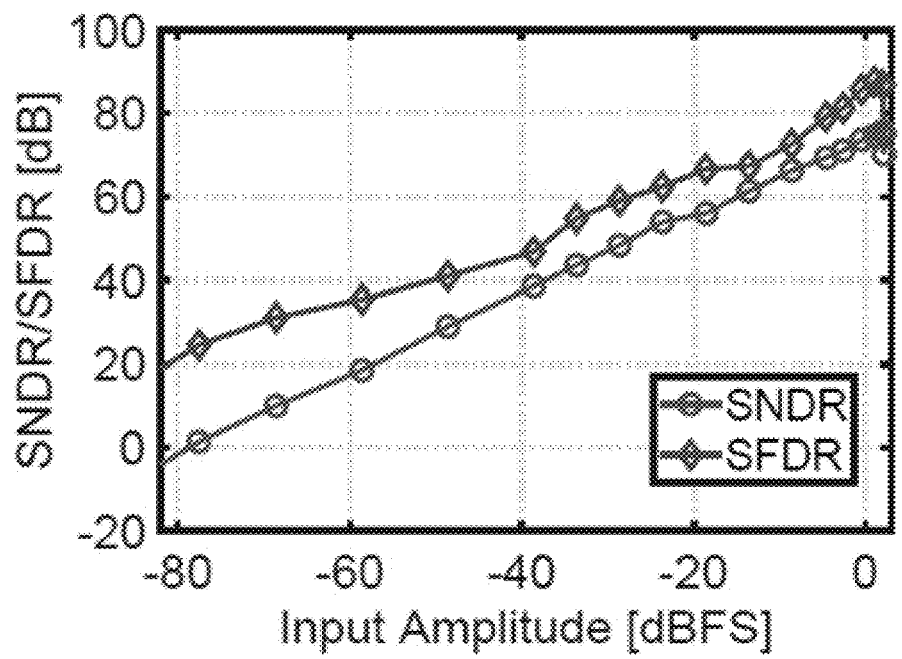
Figure 14:
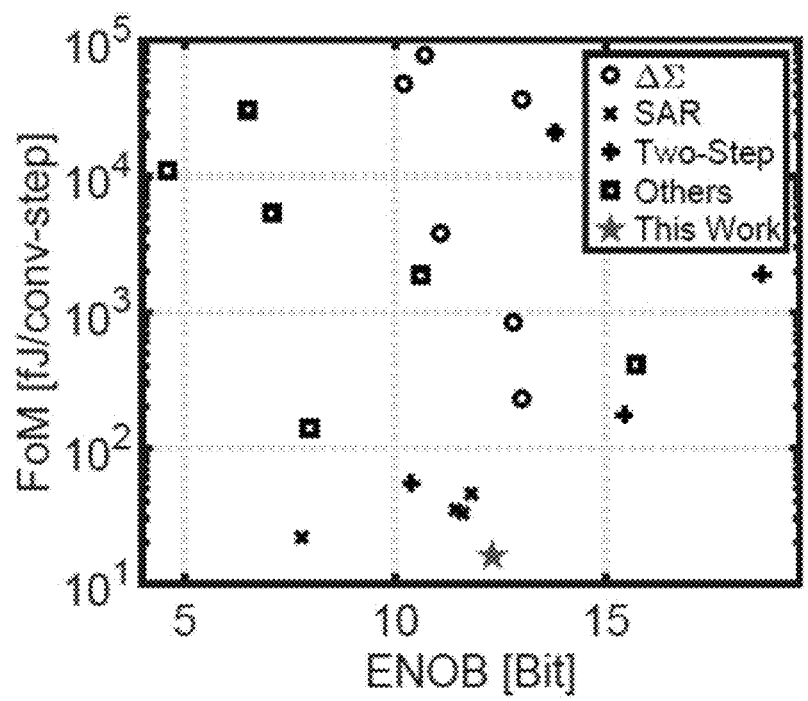
Figure 15:
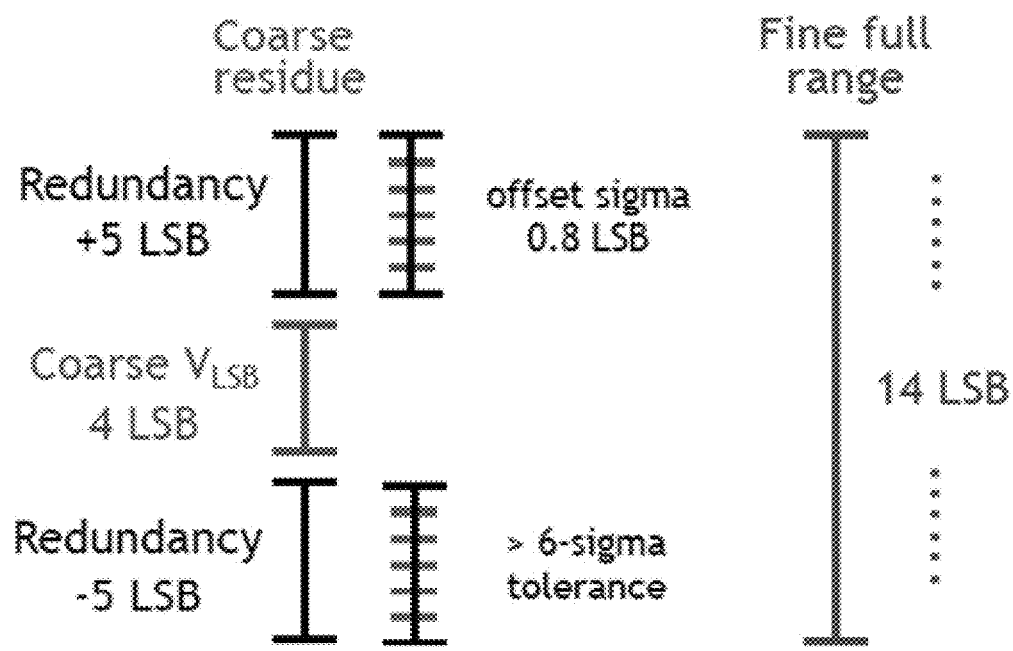
Figure 16:
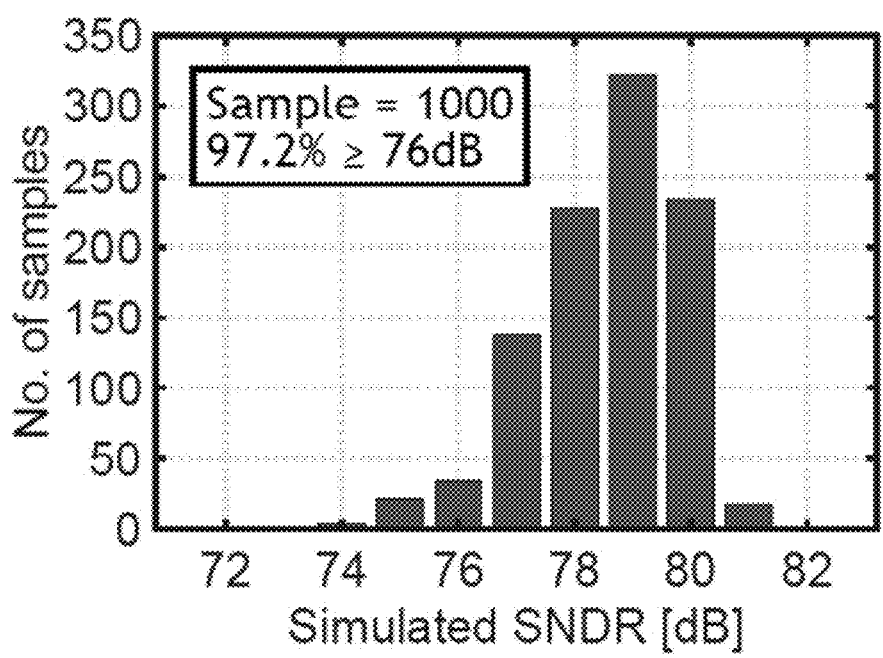
Figure 17A:
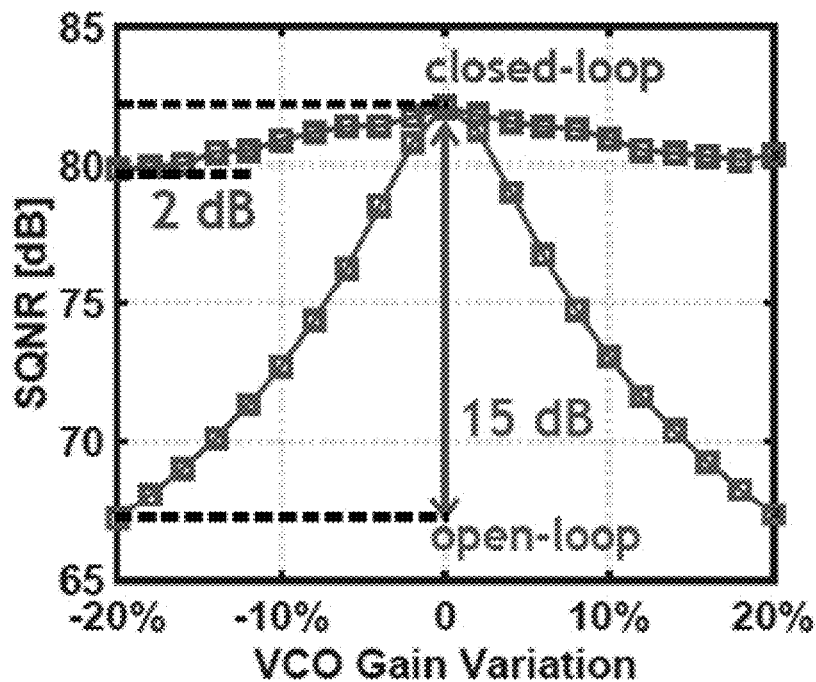
Figure 17B:
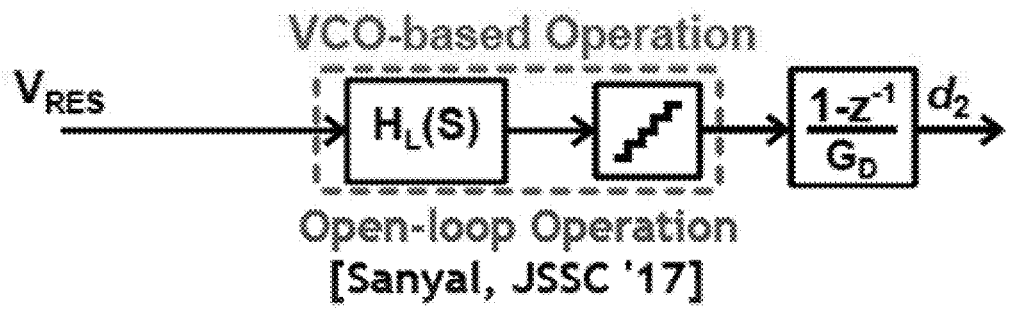
Figure 17B:
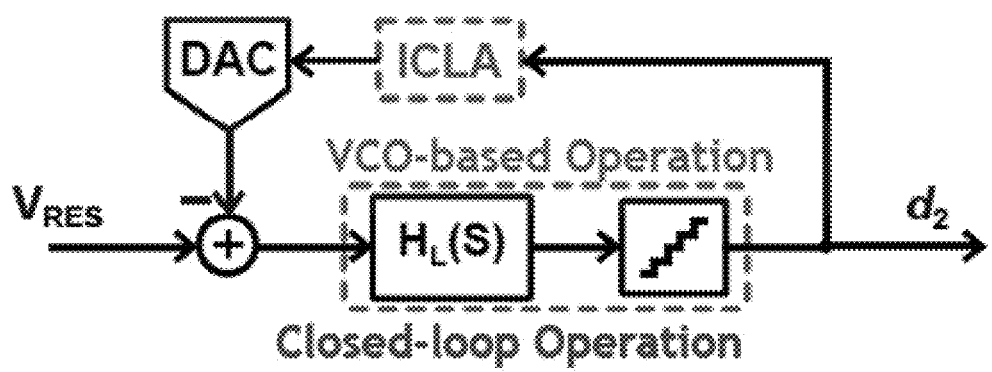

FIGS. 7A and 7B provide additional experimental results of a localization and motion tracking application. In FIGS. 7B and 7C, velocity of the indoor aerial robot 402 is determined using the active marker capture device 502 and the passive markers, respectively. It can be observed that the while the velocity information in FIGS. 7A and 7B are nearly identical, the extracted data using the passive markers are substantially noisier. Indeed, the active marker capture device 502 provides substantially improved tracking of the indoor aerial robot 402 with respect to flight control, flight path, directional steering, elevation control, maneuverability, evasive procedures, and the like.

Discussion Optical motion capture systems are widely used in indoor aerial robots due to the GPS-denied environment. Systems such as OptiTrack [1], Vicon [2], and Qualisys [3] are among popular choices. As shown in FIG. 1, these motion capture systems usually incorporate multiple ceiling-mounted infrared cameras to track reflective markers installed on robots. To ensure the visibility of the markers, there are infrared lamps integrated on the cameras that illuminate the capture volume.

Passive markers such as reflective balls or tapes are widely used in motion capture systems [4]. These markers are usually affixed on the robots with screws or adhesives. The markers reflect the illumination from the infrared lamp back to the cameras, and a computer software calculates the 3D pose of the robot from the images taken at different locations. However, both the environment and the surface of the robot may reflect the infrared illumination in addition to the markers. For instance, as can be seen in FIGS. 6A and 6B, reflection from the shiny surface of the robot can be incorrectly recognized as motion capture markers. The excessive reflection causes interference to the motion capture system, and impacts both the accuracy and reliability of the measurement.

Active markers typically use infrared LEDs (light emitting diode) that are visible to the motion capture cameras. The self-illuminating nature of the active markers eliminates the need for external infrared lamps. As a result, the interference due to the excess reflection from the external illumination is resolved. The infrared LEDs are also significantly brighter than the reflective marker, and can be operated at higher sampling frequency and with greater accuracy [5]. There are a few active makers on the market, but unfortunately none of them meet the strict payload limitation of miniature indoor aerial robots. Standalone LEDs are available for motion capture systems [6, 7]. However, external electronics and wiring are required to drive the LEDs. There are also active markers with corresponding LED controllers [8, 9, 10, 11]. However, the weight of these systems is significantly over the payload limitations of miniature aerial vehicles.

Components lower weight and form factor: As discussed above, the weights of the illumination stripe and the driver circuit are about 0.7 and 0.3 grams. The total weight of the active marker is approximately only one gram. As comparison, each medium-sized passive marker as used in FIG. 5 weights 1.9 grams, and the total mass adds up to 7.6 grams. The reduced weight is a very favorable feature for miniature-sized robots which usually have very limited payload capacity.

Ease of use: Standalone LEDs are available as accessories of certain motion capture systems [6, 7]. However, external electronics and wiring are required to drive the LEDs. As comparison, the exemplary active positioning marker includes a miniature-sized driver circuit, and the entire system only requires plugging the power supply to operate.

System lower weight and form factor: There are existing active markers with corresponding LED controllers [8, 9, 10, 11]. However, the weight of such systems are significantly beyond the payload limitation of many small-sized robots. For instance, the total weight of the active marker [12] is more than 100 grams, and the area of the driver is more than 43 cm2. As comparison, the total weight of the exemplary active positioning marker has been shown in some embodiments to be approximately one gram, and the area of the driver is only around 1.2 cm$^2$.

While the various embodiments described herein can operate in indoor environment, it is noted that systems can also operation in non-ideal conditions and over extended temperature and humidity ranges.

It should be appreciated that the logical operations described above and in the appendix can be implemented (1) as a sequence of computer-implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as state operations, acts, or modules. These operations, acts and/or modules can be implemented in software, in firmware, in special purpose digital logic, in hardware, and any combination thereof. It should also be appreciated that more or fewer operations can be performed than shown in the figures and described herein. These operations can also be performed in a different order than those described herein.

The following patents, applications and publications as listed below and throughout this document are hereby incorporated by reference in their entirety herein.

[1] OptiTrack Motion Capture System, NaturalPoint Inc, 2020. [Online]. Available: https://optitrack.com/.

[2] VICON Motion Capture System, Vicon Motion Systems Ltd, 2020. [Online]. Available: https://www.vicon.com/.

[3] Qualisys Motion Capture System, Qualisys AB, 2020. [Online]. Available: https://www.qualisys.com/.

[4] Markers & Suits, Vicon Motion Systems Ltd, 2020. [Online]. Available: https://www.vicon.com/hardware/accessories/.

[5] D. N. Rutherford, A.-L. D. D'Angelo, K. E. Law, and C. M. Pugh, "Advanced engineering technology for measuring performance", Surgical Clinics of North America, vol. 95, no. 4, pp. 813-826, 2015.

[6] Ultra-Wide Angle 850 nm Infrared LED, NaturalPoint Inc, 2020. [Online]. Available: https://optitrack.com/products/motion-capture-markers/#1ed1010.

[7] Active Markers, Advanced Realtime Tracking GmbH, 2020. [Online]. Available: https://artracking.com/products/markers-targets/markers/.

[8] Active Markers, Qualisys AB, 2020. [Online]. Available: https://www.qualisys.com/hardware/accessories/active-markers/.

[9] Impulse X2 System, PhaseSpace Inc, 2017. [Online]. Available: http://www.phasespace.com/impulse-motion-capture.html.

[10] OptiTrack Active Components, NaturalPoint Inc, 2020. [Online]. Available: tps://optitrack.com/products/active-components/.

[11] Polaris accessories, Northern Digital Inc., 2020. [Online]. Available: https://www.ndigital.com/medical/products/accessories/.

[12] Short Range Active Marker, Qualisys AB, 2018. [Online]. Available: https://cdn-content.qualisys.com/2018/07/PI_Short_Range_Active_Marker.pdf.

What is claimed is:

1. A capacitance-to-digital converter (CDC) comprising:
   a first stage successive approximation register capacitance-to-digital converter ($1^{st}$ stage SAR CDC) circuit portion configured to perform a plurality of successive approximations of an input capacitance signal to generate a SAR conversion residue and a first set of converted outputs; and
   a second stage time-domain incremental delta-sigma modulator capacitance-to-digital converter ($2^{nd}$ stage TD incremental $\Delta\Sigma$M CDC) circuit portion that quantizes the SAR conversion residue, using, in part, a voltage-controlled oscillator (VCO) based integrator of the $2^{nd}$ stage TD incremental $\Delta\Sigma$M CDC operating in a closed-loop control with a digital-to-analog converted signal generated, in part, by the first set of converted outputs, wherein the $2^{nd}$ stage TD incremental $\Delta\Sigma$M CDC generates a second set of converted outputs as a representation of an input sensed capacitance signal, and wherein the VCO integrator provides intrinsic clocked averaging (ICLA) capability that can address mismatches between the digital-to-analog converted signal and the first set of converted outputs.

2. The capacitance-to-digital converter of claim 1, wherein the $2^{nd}$ stage TD incremental $\Delta\Sigma$M CDC circuit portion comprises:
   a N-stage ring VCO circuit; and
   a phase and frequency detector (PFD) coupled to the N-stage ring VCO circuit to an output for the closed-loop control.

3. The capacitance-to-digital converter of claim 2, wherein the $2^{nd}$ stage TD incremental $\Delta\Sigma$M CDC circuit portion further comprises a passive charge sharing (CS) circuit coupled to the N-stage ring VCO circuit.

4. The capacitance-to-digital converter of claim 2, wherein the N-stage ring VCO circuit is implemented as a $G_m$-stage-driven current-controlled oscillator (CCO).

5. The capacitance-to-digital converter of claim 4, wherein the $G_m$-stage-driven CCO is configured to convert the SAR conversion residue into a frequency variation at the output N-stage ring VCO and generate output a phase difference signal.

6. The capacitance-to-digital converter of claim 5, wherein the PFD is configured to detect and integrate the phase difference signal to generate an integrated phase difference signal.

7. The capacitance-to-digital converter of claim 6, wherein the PFD comprises a multi-phase quantizer configured to transform the integrated phase difference signal to a multi-level output, the PFD further comprising a sampling circuit to sample the multi-level output.

8. The capacitance-to-digital converter of claim 1, wherein the closed-loop control comprises a first-order loop.

9. The capacitance-to-digital converter of claim 1, wherein the $2^{nd}$ stage TD incremental $\Delta\Sigma$M CDC is configured to operate in an incremental mode.

10. The capacitance-to-digital converter of claim 1, wherein the $2^{nd}$ stage TD incremental $\Delta\Sigma$M CDC is configured to disable operation during SAR operation of the $1^{st}$ stage SAR CDC.

11. The capacitance-to-digital converter of claim 1, further comprising
   a capacitance sensing network circuit coupled to the $1^{st}$ stage SAR CDC circuit portion, the capacitance sensing network circuit being configured to switch between a first capacitance sensing input associated with a first capacitive plate and a second capacitance sensing input associated with a second capacitive plate.

12. The capacitance-to-digital converter of claim 11, wherein the capacitance sensing network circuit comprises a chopper circuit, the chopper circuit being configured to perform the switching between the first capacitance sensing input and the second capacitance sensing input.

13. The capacitance-to-digital converter of claim 6, wherein the $2^{nd}$ stage TD incremental $\Delta\Sigma$M CDC is configured to disable operations during sensing operation of the capacitance sensing network circuit.

14. The capacitance-to-digital converter of claim 1, wherein the $2^{nd}$ stage TD incremental $\Delta\Sigma$M CDC is configured as an N-bit incremental $\Delta\Sigma$M CDC selected from the group consisting of: a 2-bit incremental $\Delta\Sigma$M CDC, a 3-bit incremental $\Delta\Sigma$M CDC, a 4-bit incremental $\Delta\Sigma$M CDC, a 5-bit incremental $\Delta\Sigma$M CDC, a 6-bit incremental $\Delta\Sigma$M CDC, a 7-bit incremental $\Delta\Sigma$M CDC, an 8-bit incremental $\Delta\Sigma$M CDC, a 9-bit incremental $\Delta\Sigma$M CDC, and a 10-bit incremental $\Delta\Sigma$M CDC.

15. The capacitance-to-digital converter of claim 1, wherein the capacitance-to-digital converter is configured in a microcontroller.

16. The capacitance-to-digital converter of claim 1, wherein the capacitance-to-digital converter is configured as an integrated chip.

17. A method of converting a sensed capacitance signal, associated with a capacitance source, to an output digital signal representing the sensed capacitance signal, the method comprising:
   successively approximating over a first set of plurality of approximations, the sensed capacitance signal to generate i) a residue signal and ii) a first set of converted outputs of the digital signal;
   generating a first digital-to-analog converted signal of the first set of converted outputs of the digital signal;
   quantizing the residue signal, using, in part, a voltage-controlled oscillator (VCO) based integrator operating in a closed-loop control with a digital-to-analog converted signal generated, in part, by the first set of converted outputs; and
   generating a second digital-to-analog converted signal of the second set of converted outputs of the digital signal representing the sensed capacitance signal; and
   combining the first digital-to-analog converted signal and second digital-to-analog converted signal to generate a capacitance-to-digital conversion output,
   wherein the VCO integrator provides intrinsic clocked averaging (ICLA) capability that can address mismatches between the first digital-to-analog converted signal and the second digital-to-analog converted signal.

18. The method of claim 17, wherein the quantification operation comprises:
   converting the residue signal into a frequency variation to generate an output a phase difference signal;
   integrating the phase difference signal to generate an integrated phase difference signal; and
   transforming the integrated phase difference signal to a multi-level output for the closed-loop control.

19. The method of claim 17, wherein the quantization operation is performed via a time-domain sigma-delta modulator (TD $\Delta\Sigma$M).

20. An apparatus comprising:
   a first stage successive approximation register capacitance-to-digital converter ($1^{st}$ stage SAR CDC) circuit portion configured to perform a plurality of successive approximations of an input capacitance signal to generate a SAR conversion residue and a first set of converted outputs; and
   a second stage time-domain incremental delta-sigma modulator capacitance-to-digital converter ($2^{nd}$ stage TD incremental $\Delta\Sigma$M CDC) circuit portion that quantizes the SAR conversion residue, using, in part, a voltage-controlled oscillator (VCO) based integrator of the $2^{nd}$ stage TD incremental $\Delta\Sigma$M CDC operating in a closed-loop control with a digital-to-analog converted signal generated, in part, by the first set of converted outputs, wherein the $2^{nd}$ stage TD incremental $\Delta\Sigma$M CDC generates a second set of converted outputs as a representation of an input sensed capacitance signal, and wherein the VCO integrator provides intrinsic clocked averaging (ICLA) capability that can address mismatches between the digital-to-analog converted signal and the first set of converted outputs.

* * * * *